(12) United States Patent
Suginohara et al.

(10) Patent No.: US 8,154,162 B2
(45) Date of Patent: Apr. 10, 2012

(54) MOTOR AND DISK DRIVE APPARATUS PROVIDED WITH A CIRCUIT BOARD WITH WIRINGS

(75) Inventors: Takahiro Suginohara, Kyoto (JP);
Haruhiko Ito, Kyoto (JP); Toshihide Sonoda, Kyoto (JP); Takuya Yamane, Kyoto (JP)

(73) Assignee: Nidec Corporation, Kyoto (JP)

( * ) Notice: Subject to any disclaimer, the term of this patent is extended or adjusted under 35 U.S.C. 154(b) by 117 days.

(21) Appl. No.: 12/392,449

(22) Filed: Feb. 25, 2009

(65) Prior Publication Data
US 2009/0212651 A1   Aug. 27, 2009

(30) Foreign Application Priority Data
Feb. 26, 2008 (JP) ................. 2008-044160

(51) Int. Cl.
*H02K 11/00* (2006.01)
(52) U.S. Cl. ........................................ 310/71
(58) Field of Classification Search ............ 310/71, 310/68 R, DIG. 6
See application file for complete search history.

(56) References Cited

U.S. PATENT DOCUMENTS

| 6,809,439 B2 * | 10/2004 | Iwase et al. ............. 310/49.01 |
| 2006/0227455 A1 * | 10/2006 | Tamaoka et al. ........... 360/99.08 |
| 2007/0294712 A1 | 12/2007 | Ito et al. |
| 2008/0012452 A1 * | 1/2008 | Tsukamoto et al. ......... 310/68 B |

FOREIGN PATENT DOCUMENTS

| JP | 05236692 A | * | 9/1993 |
| JP | 6-252519 A | | 9/1994 |
| JP | 10127031 A | * | 5/1998 |
| JP | 10-248190 A | | 9/1998 |
| JP | 2002119002 A | * | 4/2002 |

OTHER PUBLICATIONS

Furuya et al, JP10127031A Machine Translation, May 1998.*
Akaha et al, JP 2002119002A Machine Translation, Apr. 2002.*

* cited by examiner

*Primary Examiner* — Quyen Leung
*Assistant Examiner* — Eric Johnson
(74) *Attorney, Agent, or Firm* — Westerman, Hattori, Daniels & Adrian, LLP

(57) ABSTRACT

A motor for holding a disk with a mounting opening in place includes a rotor unit including a rotor magnet rotatable about a central axis and a stator unit including a stator arranged opposite to the rotor magnet and a circuit board electrically connected to the stator. Wiring lines of the circuit board include output-side land portions electrically connected to first ends of coils of the stator, a connection-side land portion electrically connected to second ends of the coils forming a neutral point, a connection portion electrically connected to an external power source, output-side wiring portions arranged to electrically interconnect the output-side land portions and the connection portion, and a connection-side wiring portion arranged to electrically interconnect the connection-side land portion and the connection portion. Each of the output-side wiring portions has a width greater than a width of the connection-side wiring portion.

18 Claims, 10 Drawing Sheets

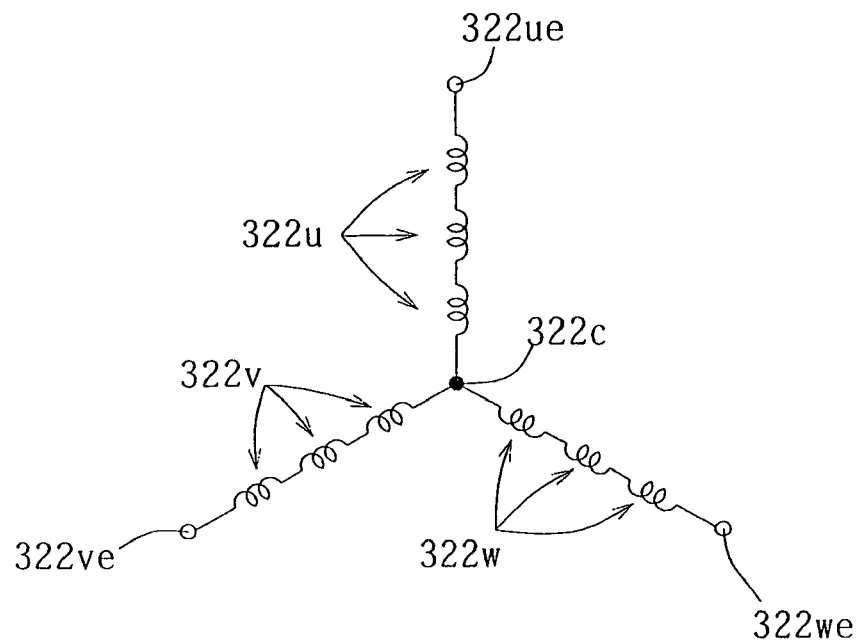
FIG.5
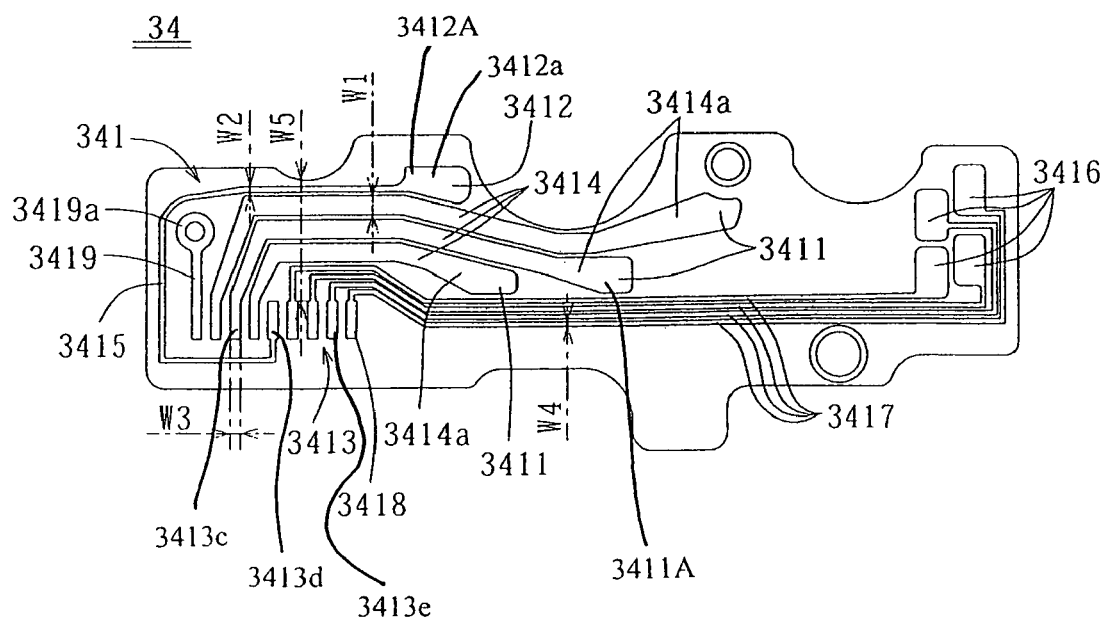

MOTOR AND DISK DRIVE APPARATUS PROVIDED WITH A CIRCUIT BOARD WITH WIRINGS

FIELD OF THE INVENTION

The present invention relates to a motor for holding a disk with an opening used in mounting the disk to the motor (hereinafter referred to as a "mounting opening") and a disk drive apparatus provided with the motor.

BACKGROUND OF THE INVENTION

Conventionally, a motor having a chucking unit for removably holding an optical disk such as a DVD or the like is provided with a circuit board through which an electric current is supplied to the coils of a stator. Along with the size reduction of a disk drive apparatus, attempts have been made to reduce the size of motor. The reduction in size of the motor makes it necessary to reduce the area of the circuit board. Furthermore, the reduction in price of the disk drive apparatus makes it inevitable to reduce the motor price.

As one approach to the motor price reduction, there is known a method by which the price of a circuit board is reduced by using only one surface of the circuit board. One example of the conventional motors that include a chucking unit and make uses of only one surface of a circuit board is disclosed in, e.g., Japanese Patent Laid-open Publication No. 10-248190.

In recent years, an increase in the writing speed of a disk leads to an increase in the rotation speed of a motor that holds the disk in place. One method of increasing the motor rotation speed is to increase the electric current supplied to coils. Since the space required in forming wiring lines of a circuit board is reduced along with the size reduction of the circuit board, however, it is impossible to increase the electric current supplied to the coils. In other words, the size reduction of the circuit board results in the reduction of a permissible current value in the wiring lines of the circuit board, thereby limiting the electric current supplied to the coils. In particular, since only one surface of the circuit board is used for the purpose of motor price reduction, the space required in forming the wiring lines is remarkably reduced by the size reduction of the circuit board. This makes it impossible to increase the rotation speed of the motor.

SUMMARY OF THE INVENTION

The present invention provides a motor capable of increasing an electric current supplied to coils and consequently enjoying an increased rotation speed, which is made possible by reducing the electric resistance of a circuit board and component parts used in connecting the circuit board to external devices.

In accordance with a first aspect of the present invention, there is provided a motor for holding a disk with a mounting opening in place, including:
a rotor unit including a rotor magnet rotatable about a central axis; and
a stator unit including a stator arranged opposite to the rotor magnet and a circuit board electrically connected to the stator, wherein
the stator includes a plurality of coils made of a conductive wire and arranged to generate magnetic fields,
the circuit board is provided with wiring lines electrically connected to the coils,
the wiring lines include output-side land portions electrically connected to first ends of the coils, a connection-side land portion electrically connected to second ends of the coils forming a neutral point, a connection portion electrically connected to an external power source or an external circuit board, output-side wiring portions arranged to electrically interconnect the output-side land portions and the connection portion, and a connection-side wiring portion arranged to electrically interconnect the connection-side land portion and the connection portion, and
each of the output-side wiring portions has a width greater than a width of the connection-side wiring portion.

With the first aspect of the present invention, the width of the output-side wiring portions extending from the connection portion to the output-side land portions of the wiring lines is set greater than the width of the connection-side wiring portion. This ensures that the electric resistance of the output-side wiring portions against the electric current supplied to the coils becomes smaller than the electric resistance of the connection-side wiring portion against the electric current flowing therethrough. Therefore, it is possible to increase the electric current supplied from an external power source to the coils. As a consequence, it is possible to intensify the magnetic fields generated in the coils and to increase the rotation speed of the motor.

In accordance with a second aspect of the present invention, there is provided a motor for holding a disk with a mounting opening in place, including:
a rotor unit including a rotor magnet rotatable about a central axis; and
a stator unit including a stator arranged opposite to the rotor magnet and a circuit board electrically connected to the stator, wherein
the circuit board is provided with a connection portion through which the circuit board is connected to an external device,
a flexible circuit member is connected to the connection portion,
the flexible circuit member includes a first terminal portion connected to the connection portion, a second terminal portion arranged opposite to the first terminal portion and a connection wiring portion arranged to electrically interconnect the first terminal portion and the second terminal portion, and
the connection wiring portion is laminated in plural layers and is connected to the first terminal portion and the second terminal portion.

With the second aspect of the present invention, it is possible to increase the electric current flowing through the flexible circuit member by laminating the connection wiring portion in plural layers. This makes it possible to increase the electric current supplied to the coils. As a consequence, it is possible to intensify the magnetic fields generated in the coils and to increase the rotation speed of the motor.

BRIEF DESCRIPTION OF THE DRAWINGS

The objects and features of the present invention will become apparent from the following description of preferred embodiments, given in conjunction with the accompanying drawings, in which:

FIG. 4 is a schematic view illustrating a connection state of coils in the stator of the present invention;

FIG. 5 is a schematic axial top plan view illustrating a circuit board of the present invention, with a sensor unit removed from the circuit board;

DETAILED DESCRIPTION OF THE PREFERRED EMBODIMENTS

Overall Structure of Brushless Motor

Figure 1:
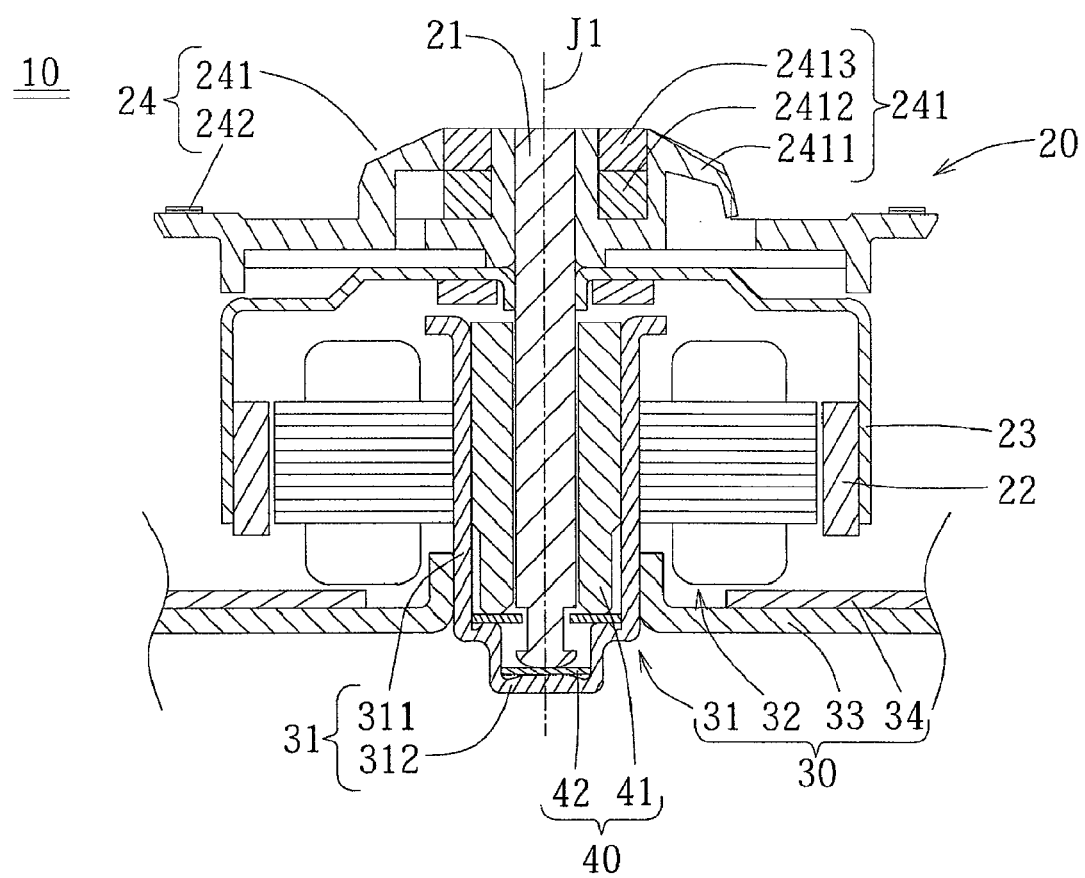
FIG. 1 is an axially-cut schematic section view showing a motor in accordance with the present invention.
Figure 2:
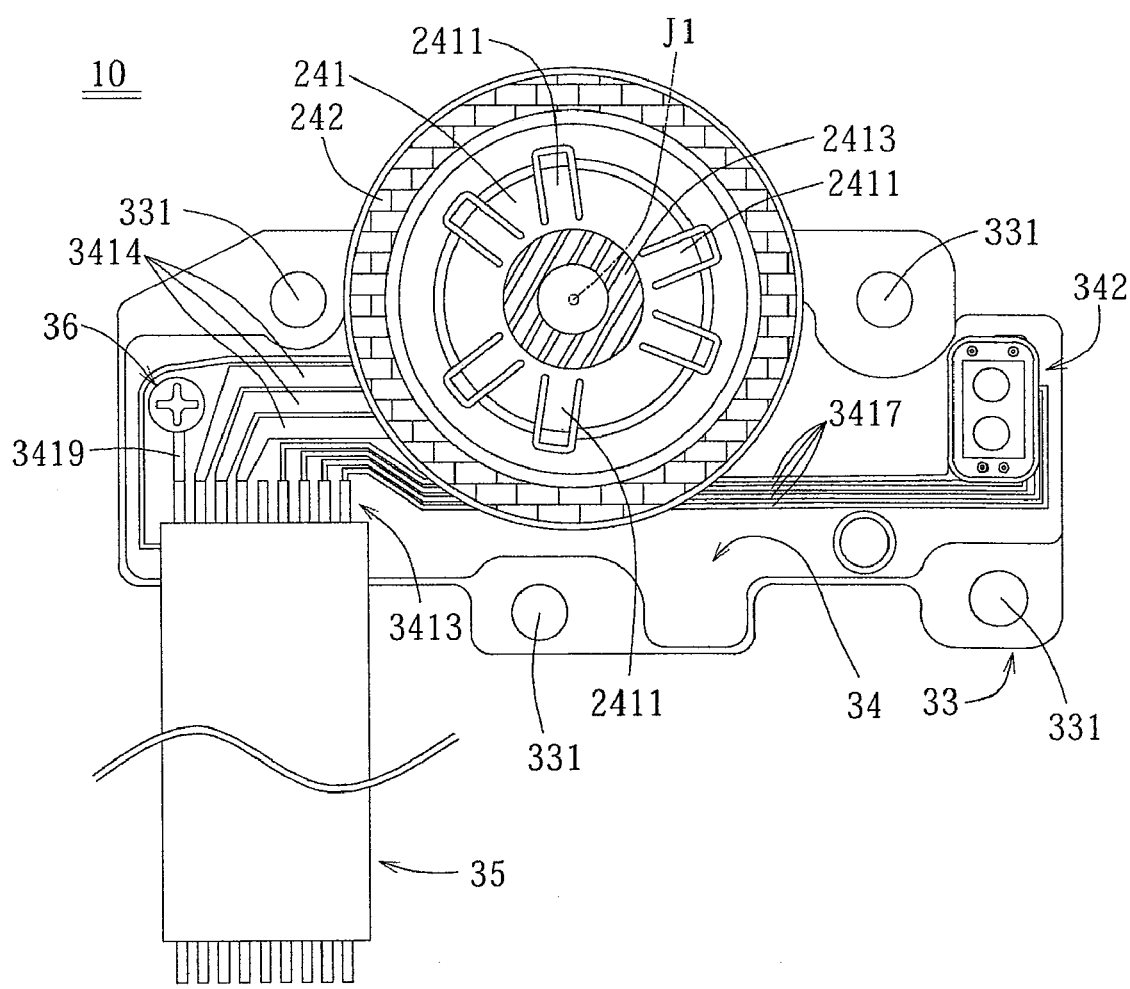
FIG. 2 is a schematic axial top plan view showing the motor in accordance with the present invention.

The overall structure of a brushless motor (hereinafter simply referred to as a "motor") in accordance with an embodiment of the present invention will now be described with reference to FIGS. 1 and 2. FIG. 1 is a schematic section view of a motor 10 of the present embodiment taken along a plane containing a central axis J1. FIG. 2 is a schematic axial top plan view showing the motor 10.

Referring to FIG. 1, the motor 10 includes a rotor unit 20 rotating about the central axis J1 and having a rotor magnet 22, a stator unit 30 having a stator 32 opposed to the rotor magnet 22 with a gap left therebetween, and a bearing mechanism 40 for rotatably supporting the rotor unit 20. The motor 10 of the present embodiment is a three-phase brushless motor. In the following description, the side on which the rotor unit 20 lies along the central axis J1 will be denoted by a term "upper" and the side on which the stator unit 30 lies along the central axis J1 will be signified by a term "lower". However, the central axis J1 does not necessarily coincide with the direction of gravity.

The rotor unit 20 includes a shaft 21 coaxial with the central axis J1, a rotor holder 23 fixed to the shaft 21, the rotor magnet 22 held in place by the rotor holder 23 and a chucking unit 24 arranged on an upper surface of the rotor holder 23.

The chucking unit 24 includes a center case 241 to which the mounting opening of a disk is fitted in a removable manner, and a disk support portion 242 provided in an outer peripheral portion of the center case 241 to support the disk (see FIG. 2). The center case 241 includes centering claws 2411 arranged to make contact with the mounting opening of the disk and to align the center of the mounting opening with the central axis J1, a substantially disk-shaped yoke 2412 made of a magnetic material and arranged radially inwards of the centering claws 2411 and a clamp magnet 2413 arranged to magnetically attract a clamp member 54 (see FIG. 8). The disk support portion 242 is formed of an annular rubber member or the like capable of preventing sliding movement of the disk. The disk support portion 242 is attached to the outer peripheral portion of the center case 241.

The stator unit 30 includes a housing 31 having a cylindrical holder portion 311 arranged to hold the stator 32 in place and a bottom portion 312, a substantially planar attachment plate 33 fixed to the cylindrical holder portion 311 and arranged axially below the stator 32, a circuit board 34 attached to the upper surface of the attachment plate 33, and a flexible circuit member such as a flexible flat cable 35 (see FIG. 2) connected to the circuit board 34 and arranged to connect the circuit board 34 with another circuit board (not shown).

The attachment plate 33 is formed of a metallic flat plate having an area greater than that of the circuit board 34. Attachment holes 331 are formed in a plurality of regions of the attachment plate 33 protruding away from the outer edge of the circuit board 34. As can be seen in FIG. 2, a screw 36 for assuring electric conduction between the circuit board 34 and the attachment plate 33 is fixed to the attachment plate 33 through the circuit board 34. The screw 36 is made of metal and makes contact with a ring portion 3419a (see FIG. 5) of a conduction wiring portion 3419 of the circuit board 34 and also with the attachment plate 33. This makes it possible to equalize the ground potential of the ring portion 3419a with the potential of the attachment plate 33. Therefore, it is possible for the attachment plate 33 to prevent electromagnetic waves generated in an external circuit board from infiltrating into the circuit board 34.

The bearing mechanism 40 includes a first bearing portion 41 held on the inner circumferential surface of the cylindrical holder portion 311 of the housing 31 and a second bearing portion 42 arranged on the upper surface of the bottom portion 312. The first bearing portion 41 has a cylindrical shape with a bore into which the shaft 21 is inserted. The first bearing portion 41 is made of an oil-impregnated sintered material. The second bearing portion 42 is formed of a substantially disk-shaped resin material with superior slidability.

<Configuration of Stator>

Figure 3:
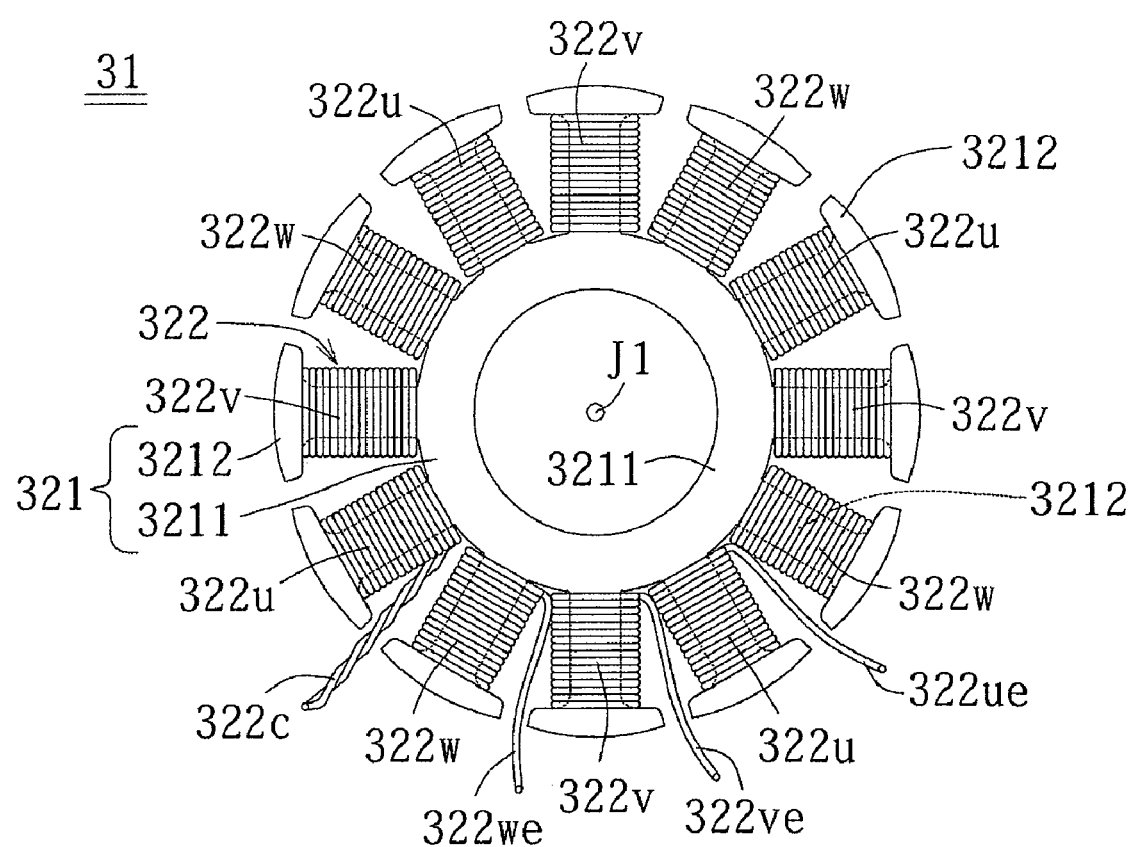
FIG. 3 is a schematic axial top plan view showing a stator of the present invention.

Next, the configuration of the stator 32 in accordance with the present embodiment of the present invention will be described with reference to FIGS. 3 and 4. FIG. 3 is a schematic axial top plan view showing the stator 32 of the present invention. FIG. 4 is a schematic view illustrating a connection state of coils 322 in the stator 32 of the present embodiment.

Referring to FIG. 3, the stator 32 includes a stator core 321 formed by axially laminating magnetic thin plates and a plurality of coils 322 formed by winding conductive wires on the stator core 321.

The stator core 321 includes an annular core-back portion 3211 concentric with the central axis J1 and a plurality of tooth portions 3212 extending radially outwards from the core-back portion 3211. The tooth portions 3212 are arranged in a circumferentially spaced-apart relationship with one another. The number of the tooth portions 3212 is twelve in the present embodiment.

Conductive wires are wound on the tooth portions 3212 to form the coils 322. The number of the coils 322 is twelve in the present embodiment. Referring to FIG. 4, the coils 322 are formed of three conductive wires, i.e., U-phase, V-phase and W-phase conductive wires. In FIG. 4, the U-phase, V-phase and W-phase conductive wires are designated by reference numerals 322u, 322v and 322w, respectively. The end portions of the three conductive wires are connected into a star connection, thereby creating a single neutral point 322c.

The end portion 322ue of the U-phase coil 322u, the end portion 322ve of the V-phase coil 322v, the end portion 322we of the W-phase coil 322w and the neutral point 322c are connected to the circuit board 34 (see FIG. 2).

<Configuration of Circuit Board>

Next, the circuit board 34 of the present embodiment will be described with reference to FIGS. 5 and 6. FIG. 5 is a schematic axial top plan view illustrating the circuit board 34 of the present embodiment, with a sensor unit 342 removed from the circuit board 34.

Referring to FIG. 5, the circuit board 34 is made of paper phenol, glass fabric epoxy or the like. The circuit board 34 is provided with wiring lines 341 having a specified thickness. The wiring lines 341 are made of a copper foil. Attached to the circuit board 34 is the sensor unit 342 (see FIG. 2) that emits light toward the slit-like information patterns (not shown) formed on the lower surface of the disk (namely, the surface of the disk making contact with the disk support portion 242) and receives the light reflected from the disk.

The wiring lines 341 include three output-side land portions 3411 electrically connected to the end portion 322ue of the U-phase coil 322u, the end portion 322ve of the V-phase coil 322v and the end portion 322we of the W-phase coil 322w, respectively; a connection-side land portion 3412 electrically connected to the neutral point 322c; a connection portion 3413 provided in a section of the peripheral edge of the circuit board 34 and electrically connectable to an external power source (not shown) or an external circuit board (not shown); three output-side wiring portions 3414 arranged to electrically interconnect the three output-side land portions 3411 and the connection portion 3413; and a connection-side wiring portion 3415 arranged to electrically interconnect the connection-side land portion 3412 and the connection portion 3413.

The wiring lines 341 further include sensor-side land portions 3416 electrically connected to the sensor unit 342 and sensor-side wiring portions 3417 arranged to electrically interconnect the sensor-side land portions 3416 and the connection portion 3413.

The connection portion 3413 includes a plurality of substantially rectangular terminal portions 3418. The terminal portions 3418 are electrically connected to the output-side wiring portions 3414, the connection-side wiring portion 3415 and the sensor-side wiring portion 3417, respectively. Alternatively, the terminal portions 3418 may have a substantially elliptical shape.

In an embodiment, as shown in FIG. 5, the circuit board includes a first coil wiring line 3411A having: an output-side land portion 3411 made of an increased width portion 3414a at an end of the first coil wiring line for being electrically connected to first ends of the coils; a first connection portion 3413c made of a uniformed width portion at the other end of the first coil wiring line for being electrically connected to an external power source or an external circuit board; and an output-side wiring portion 3414 arranged to electrically interconnect the output-side land portion 3411 and the first connection portion 3413c. In an embodiment, as shown in FIG. 5, the circuit board includes a second coil wiring line 3412A having: a connection-side land portion 3412 made of an increased width portion at an end of the second coil wiring line for being electrically connected to second ends of the coils forming a neutral point; a second connection portion 3413d made of a uniformed width portion at the other end of the second coil wiring line for being electrically connected to the external power source or the external circuit board; and a connection-side wiring portion 3415 arranged to electrically interconnect the connection-side land portion 3412 and the second connection portion 3413d.

The circuit board 34 is further provided with the conduction wiring portion 3419 that makes electric conduction to the screw 36 (see FIG. 2). The conduction wiring portion 3419 has the ring portion 3419a remaining in contact with the screw 36. In this regard, the conduction wiring portion 3419 forms a ground potential. In order to assure electric conduction between the circuit board 34 and the attachment plate 33, the potential of the attachment plate 33 is made equal to the ground potential through the screw 36. As a result, the attachment plate 33 serves as a shield plate that intercepts electromagnetic waves. This makes it possible to keep the electromagnetic waves generated in an external circuit board or the like from infiltrating into the circuit board 34.

As shown in FIG. 5, the width W1 of each of the three output-side wiring portions 3414 is greater than the width W2 of the connection-side wiring portion 3415. This allows the electric resistance of the output-side wiring portions 3414 to become smaller than that of the connection-side wiring portion 3415. The reason is that the copper foil of which the wiring lines 341 are made has a uniform thickness.

The width W1 of each of the three output-side wiring portions 3414 is greater than the width W3 of the terminal portions 3418. This allows the electric resistance of the output-side wiring portions 3414 to become smaller than that of the terminal portions 3418.

Increased width portions 3414a where the width of the output-side wiring portions 3414 gradually increases are formed near the regions of the output-side wiring portions 3414 connected to the output-side land portions 3411. Presence of the increased width portions 3414a makes it possible to further reduce the electric resistance of the output-side wiring portions 3414.

Reduction of the electric resistance of the output-side wiring portions 3414 having the shape mentioned above makes it possible to increase an electric current flowing from an external power source (not shown) to the coils 322 through the connection portion 3413. Therefore, it is possible to intensify the magnetic fields generated in the coils 322 and to increase the rotation speed of the motor.

The width W4 of the sensor-side wiring portion 3417 (see FIG. 5) is smaller than the width W1 of the output-side wiring portions 3414. This makes it possible to reduce the ratio of the width occupied by the sensor-side wiring portion 3417 to the width W5 ranging from the connection portion 3413 to the peripheral edge of the circuit board 34. Therefore, it is possible to increase the ratio of the width occupied by the output-side wiring portions 3414 to the width W5. This makes it possible to further increase the width W1 of each of the output-side wiring portions 3414. As a consequence, it becomes possible to reduce the electric resistance of the output-side wiring portions 3414 and to increase the electric current supplied to the coils 322.

Description will be made on a conductor that forms the output-side wiring portions 3414 in the present embodiment. As described above, the width of the output-side wiring portions 3414 is greater than the width of the connection-side wiring portion 3415 or the width of the sensor-side wiring portion 3417.

It is preferred that the conductor has a cross-sectional area of at least $35 \times 10^{-3}$ mm$^2$ in order to control a temperature rise when applying an electric current. In this connection, the thickness of the conductor, i.e., the copper foil, practically used in the circuit board 34 is 70 μm or 35 μm. Taking this into account, it is preferred that the lower limit value of the width of the output-side wiring portions 3414 is equal to or greater than 1 mm.

In view of the spatial restriction and cost, it is preferred that the upper limit value of the cross-sectional area of the conductor is equal to or smaller than $150 \times 10^{-3}$ mm$^2$. Considering the thickness of the copper foil mentioned above, it is preferred that the upper limit value of the width of the output-side wiring portions 3414 is equal to or smaller than 2 mm.

The motor 10 of the present embodiment is a sensorless motor that does not use any magnetic detection element such as a hall element or the like. In other words, the motor 10 is a sensorless motor that detects information on the position of the rotor unit 20 by detecting the waveforms of back electromotive forces of the respective phases of the coils 322. This eliminates the need to provide the circuit board 34 with a wiring line dedicated to a magnetic detection element such as a hall element or the like, which makes it possible to further increase the width W1 of each of the output-side wiring portions 3414. Therefore, the width W1 of each of the output-side wiring portions 3414 can be efficiently increased within a predetermined area of the circuit board 34. This makes it possible to increase the electric current supplied to the coils 322 and the rotation speed of the motor.

<Structure of Flexible Flat Cable>

The structure of the present flexible flat cable 35 (hereinafter simply referred to as an "FFC 35") will be described with reference to FIGS. 6 and 7A through 7D. FIG. 6 is a schematic axial top plan view showing the FFC 35.

Figure 6:
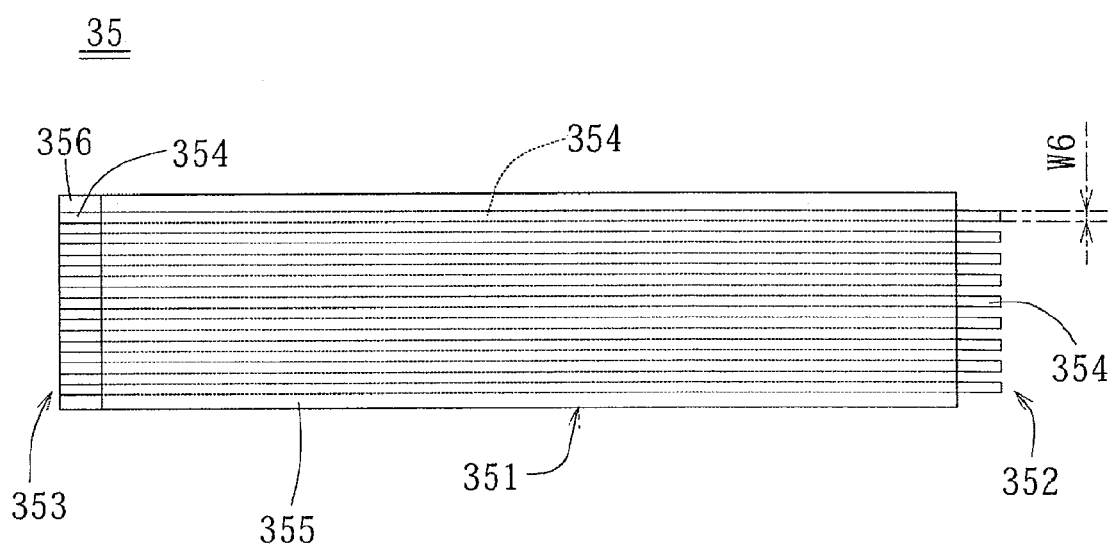
FIG. 6 is a schematic plan view showing a flexible flat cable of the present invention.

Referring to FIG. 6, the FFC 35 includes a band-like connection wiring portion 351 and terminal portions 352 and 353 provided at the longitudinal opposite ends of the connection wiring portion 351. Hereinafter, the terminal portion electrically connected to the circuit board 34 will be referred to as a "first terminal portion 352", and the terminal portion electrically connected to another circuit board and an external power source will be referred to as a "second terminal portion 353".

Figure 7A:
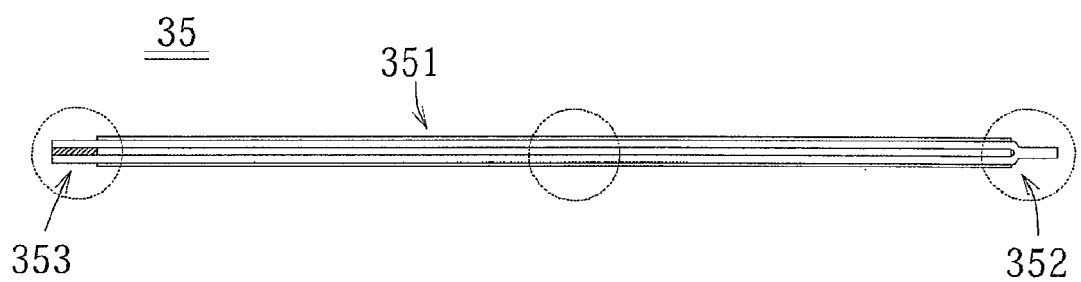
FIGS. 7A through 7D are schematic section views showing the flexible flat cable of the present invention.
Figure 7B:
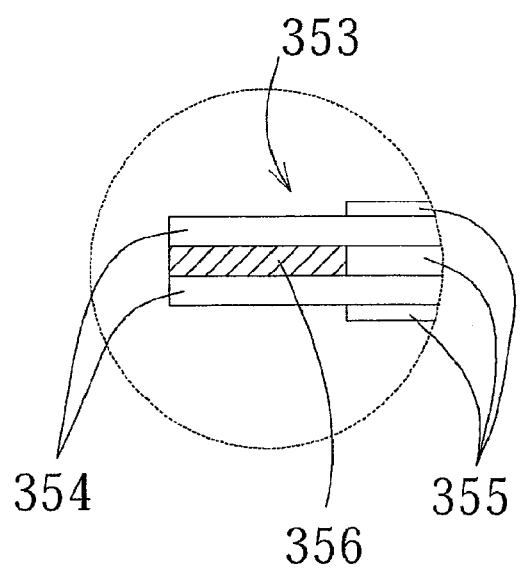
Figure 7C:
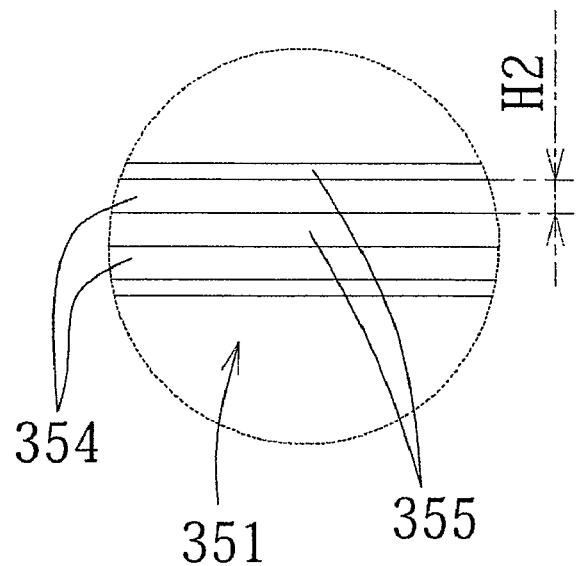
Figure 7D:
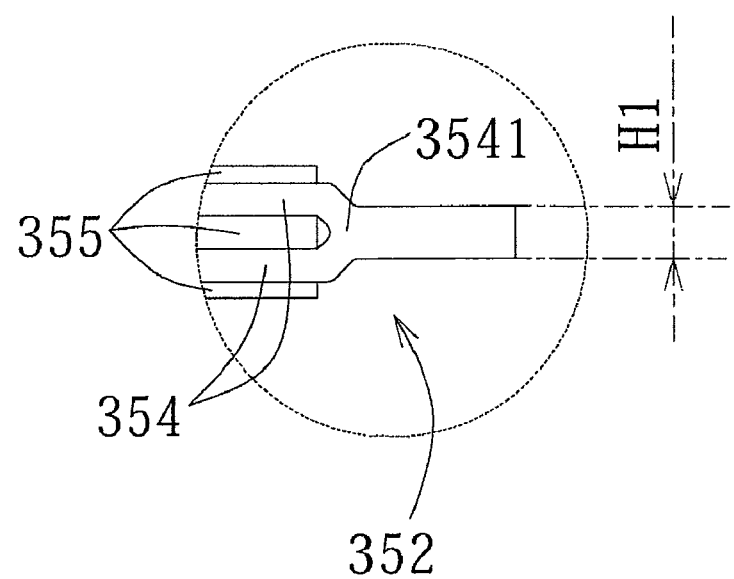

Further, FIGS. 7A through 7D are schematic views illustrating the cross-section of the FFC 35. Specifically, FIG. 7A is a schematic side view of the FFC 35 and FIGS. 7B through 7D are enlarged views of the portions indicated by dot line circles in FIG. 7A. FIG. 7B is an enlarged view showing the second terminal portion 353 indicated by a dot line circle. FIG. 7C is an enlarged view showing the region of the connection wiring portion 351 indicated by a dot line circle. FIG. 7D is an enlarged view showing the first terminal portion 352 indicated by a dot line circle.

Referring to FIGS. 7A through 7D, the FFC 35 includes band-like thin-wire conductor portions 354 that form the connection wiring portion 351 and the terminal portions 352 and 353, and an insulator portion 355 that covers the conductor portions 354 along the connection wiring portion 351 to assure electric insulation thereof.

As can be seen in FIGS. 7A through 7D, the conductor portions 354 are laminated one above the other in two layers with the insulator portion 355 interposed therebetween. The outer surfaces of the conductor portions 354 are covered with the insulator portion 355 along the connection wiring portion 351. In the region of the conductor portions 354 that forms the first terminal portion 352, there is provided a junction portion 3541 where the laminated conductor portions 354 are joined to each other. The thickness H1 of the junction portion 3541 is greater than the thickness H2 of each of the conductor portions 354. The width W6 of each of the conductor portions 354 (see FIG. 6) remains constant over the entire length thereof. In the region of the conductor portions 354 that forms the second terminal portion 353, there is arranged a reinforcing plate 356 which lies between the two laminated conductor portions 354. This means that the second terminal portion 353 is formed of the two laminated conductor portions 354 and the reinforcing plate 356 lying between the conductor portions 354.

With the construction set forth above, the cross-sectional area of the conductor portions 354 through which an electric current flows can be increased by laminating the conductor portions 354 in two layers. This makes it possible to increase the electric current supplied from an external power source to the circuit board 34 through the FFC 35, which in turn increases the electric current supplied to the coils 322. As a consequence, it is possible to intensify the magnetic fields generated in the coils 322 and to increase the rotation speed of the motor.

<Structure of Disk Drive Apparatus>

Next, a disk drive apparatus 50 provided with the motor 10 of the present embodiment will be described with reference to FIG. 8 which is a schematic section view of the disk drive apparatus 50 of the present embodiment taken along a plane containing the central axis J1.

Figure 8:
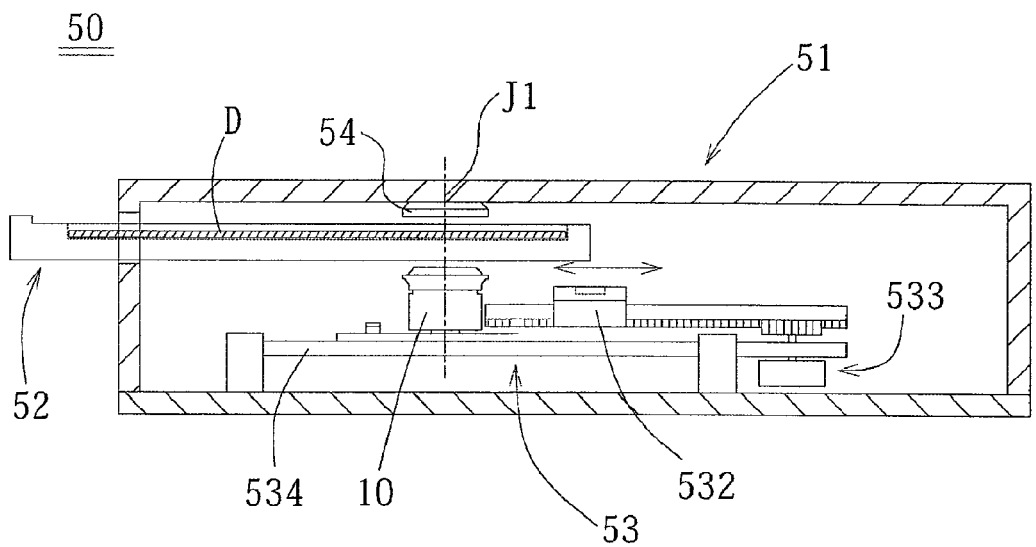
FIG. 8 is an axially-cut schematic section view showing a disk drive apparatus in accordance with the present invention.

Referring to FIG. 8, the disk drive apparatus 50 includes a housing 51 defining the contour thereof, a tray 52 arranged to load and unload a disk D into and out of the housing 51, a traverse unit 53 arranged to rotate the disk D and to perform recording and reproducing tasks, and a clamp member 54 arranged to hold the disk D in place.

The traverse unit 53 includes a spindle motor, i.e., the motor 10 of the present embodiment, arranged to rotate the disk D about the specified central axis J1, an optical pickup mechanism 532 movable in the radial direction of the motor 10 and arranged to emit and receive light toward and from the disk D, a moving mechanism 533 arranged to radially move the optical pickup mechanism 532 and a chassis 534 arranged to support the motor 10, the optical pickup mechanism 532 and the moving mechanism 533. The moving mechanism 533 includes a moving motor having an output shaft with a driving gear, and a driven gear remaining in meshing engagement with the driving gear. The disk D is mounted on the disk support portion 242 of the motor 10 (see FIG. 1).

The clamp member 54 is attached to the surface of the housing 51 positioned axially above the motor 10. The clamp member 54 holds the disk D in place by maintaining the disk D axially between itself and the disk support portion 242 of the motor 10.

When the tray 52 stays within the housing 51 with the disk D placed thereon, the traverse unit 53 is moved by an elevating device (not shown) so that it can mount the disk D on the disk support portion 242 of the motor 10. The disk D is held in place by the clamp member 54 and the disk support portion 242 of the motor 10.

In the disk drive apparatus 50 of the present embodiment, it is possible to increase the electric current supplied from an external power source (not shown) to the motor 10, which in turn makes it possible to increase the rotation speed of the motor 10. This results in an increased rotation speed of the disk D, thereby making it possible to record information on the disk D at an increased speed.

<Second Embodiment of Circuit Board>

Figure 9:
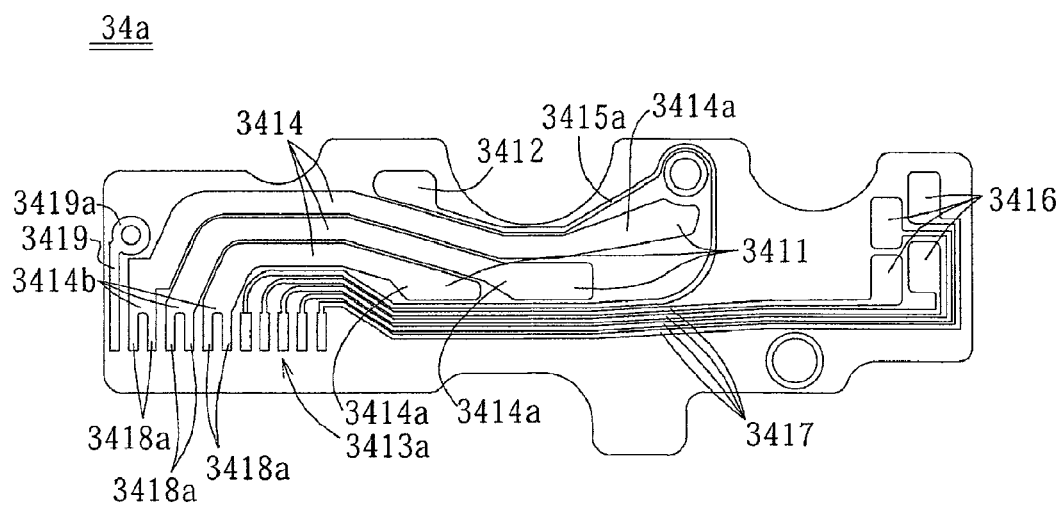
FIG. 9 is a schematic axial top plan view showing a circuit board in accordance with a second embodiment of the present invention, with a sensor unit removed from the circuit board.

Next, a circuit board in accordance with a second embodiment of the present invention will be described with reference to FIG. 9. FIG. 9 is a schematic axial top plan view showing a circuit board 34a in accordance with the second embodiment of the present invention, with the sensor unit 342 removed from the circuit board 34a. In the following description, the portions of the circuit board 34a common to those of the circuit board 34 will be designated by like reference numerals and will be omitted from description.

Referring to FIG. 9, the only difference between the circuit board 34a and the circuit board 34 resides in a connection portion 3413a. The connection portion 3413a includes a plurality of terminal portions 3418a. Each of the three output-side wiring portions 3414 is connected to the two adjoining terminal portions 3418a. Each of the output-side wiring portions 3414 has a junction portion 3414b where the adjoining terminal portions 3418a are joined to each other. The junction portion 3414b is arranged near the ends of the adjoining terminal portions 3418a. Use of this structure makes it possible to increase the electric current supplied from an external power source (not shown) to the coils 322 through the connection portion 3413a. In particular, provision of the junction portion 3414b in each of the output-side wiring portions 3414 near the ends of the two adjoining terminal portions 3418a helps minimize the region where the width of each of the output-side wiring portions 3414 shows a decrease. This makes it possible to avoid formation of the region where the electric resistance of each of the output-side wiring portions 3414 remains high. Therefore, it is possible to increase the electric current supplied to the coils 322 and the rotation speed of the motor. It is also possible for the two adjoining terminal portions 3418a to serve as one specific phase (e.g., a U-phase) when supplying an electric current. This makes it possible to increase the electric current supplied to the coils 322.

The FFC connected to the connection portion 3413a of the circuit board 34a is provided with a first terminal portion corresponding to the two adjoining terminal portions 3418a of U-phase, V-phase and W-phase. In other words, the first terminal portion includes two connection portions connected to the two adjoining terminal portions 3418a of U-phase. This holds true in case of the two adjoining terminal portions 3418a of V-phase and W-phase.

The connection-side land portion 3412 is arranged nearer to the connection portion 3413a than the output-side land portions 3411 are. Furthermore, the connection-side wiring portion 3415a is arranged to partially surround the output-side land portions 3411 and the output-side wiring portions 3414. By doing so, it becomes possible to reduce the electromagnetic waves emitted from the output-side land portions 3411 and the output-side wiring portions 3414.

<Third Embodiment of Circuit Board>

Figure 10A:
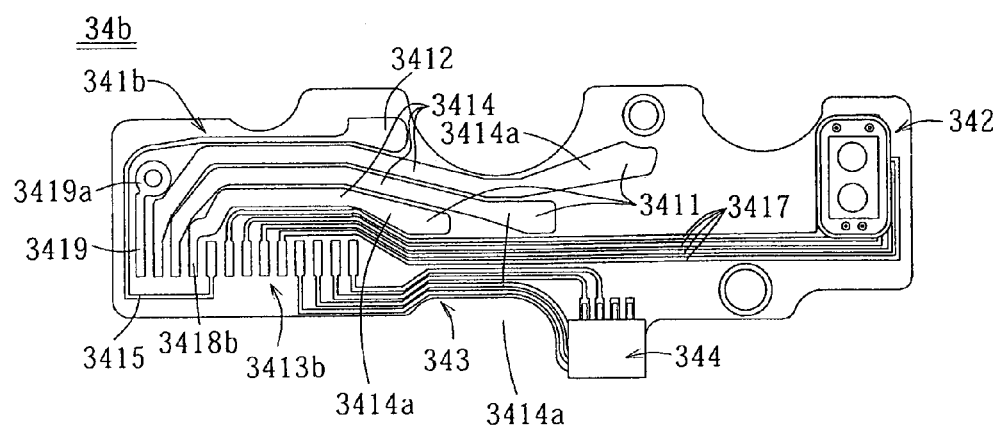
FIG. 10A is a schematic axial top plan view showing a circuit board in accordance with a third embodiment of the present invention and FIG. 10B is a schematic axial top plan view showing the circuit board of the third embodiment, with a sensor unit and a connector removed from the circuit board.
Figure 10B:
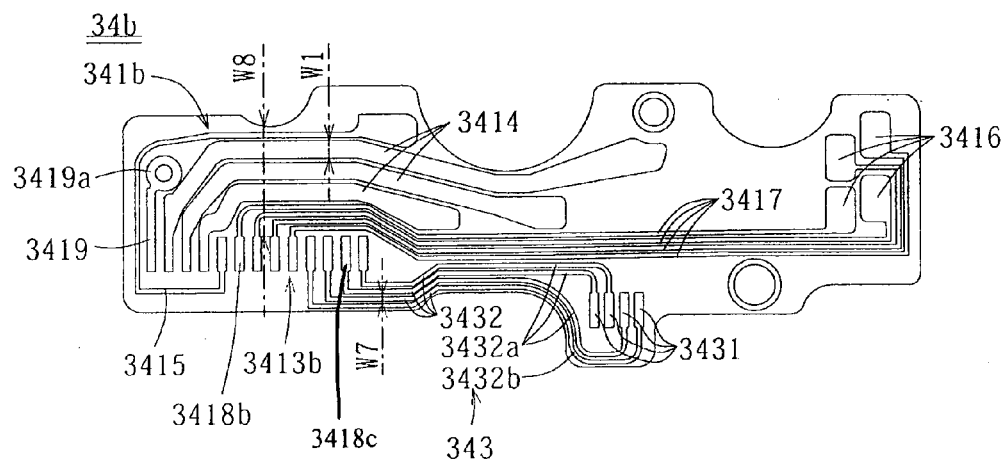

Next, a circuit board in accordance with a third embodiment of the present invention will be described with reference to FIGS. 10A and 10B. FIG. 10A is a schematic axial top plan view showing a circuit board 34b in accordance with the third embodiment of the present invention and FIG. 10B is a schematic axial top plan view showing the circuit board 34b of the third embodiment, with the sensor unit 342 and a connector 344 removed from the circuit board 34b. In the following description, the portions of the circuit board 34b common to those of the circuit board 34 will be designated by like reference numerals and will be omitted from description.

Referring to FIGS. 10A and 10B, the wiring lines 341b of the circuit board 34b is provided with power supply wiring lines 343 through which an electric current flows toward the moving motor of the moving mechanism 533 (see FIG. 9). The connector 344 is mounted to the circuit board 34b. An FFC (not shown) connectable to the moving motor of the moving mechanism 533 is connected to the connector 344. Just like the wiring lines 341, the power supply wiring lines 343 are made of a copper foil.

The power supply wiring lines 343 include a second land portion 3431 electrically connected to the connector 344 and a second wiring portion 3432 arranged to electrically interconnect the second land portion 3431 and the terminal portions 3418c. The second wiring portion 3432 includes three output-side wiring portions 3432a arranged to supply an electric current to the U-phase, V-phase and W-phase coils of a stator of the moving motor and one connection-side wiring portion 3432b arranged to supply an electric current to the neutral point.

In this regard, the width W7 of the second wiring portion 3432 is smaller than the width W1 of the output-side wiring portions 3414. This makes it possible to reduce the ratio of the region occupied by the second wiring portion 3432 to the predetermined area of the circuit board 34b, which in turn makes it possible to increase the width W1 of the output-side wiring portions 3414.

As can be seen in FIGS. 10A and 10B, the output-side wiring portions 3432a of the second wiring portion 3432 are connected to the ends of the terminal portions 3418b opposite to the ends to which the output-side wiring portions 3414 are connected. This makes it possible to increase the ratio of the output-side wiring portions 3414 to the width W8 between the connection portion 3413b and the peripheral edge of the circuit board 34b. Therefore, it is possible to increase the width of the output-side wiring portions 3414 arranged over the width W8 and consequently to reduce the electric resistance of the output-side wiring portions 3414. As a result, it is possible to maximize the width of the output-side wiring portions 3414 within the limited area of the circuit board 34b, which makes it possible to increase the electric current supplied to the coils 322. Accordingly, it is possible to intensify the magnetic fields generated in the coils 322 and to increase the rotation speed of the motor.

<Fourth Embodiment of Circuit Board>

Figure 11:
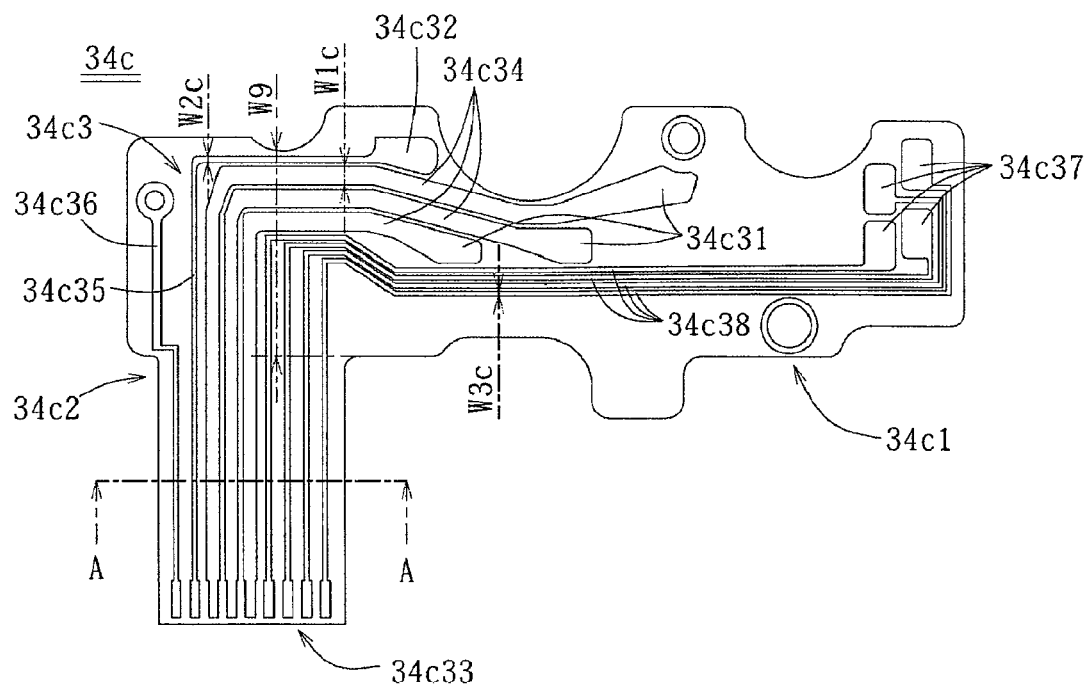
FIG. 11 is a schematic axial top plan view showing a circuit board in accordance with a fourth embodiment of the present invention.
Figure 12:
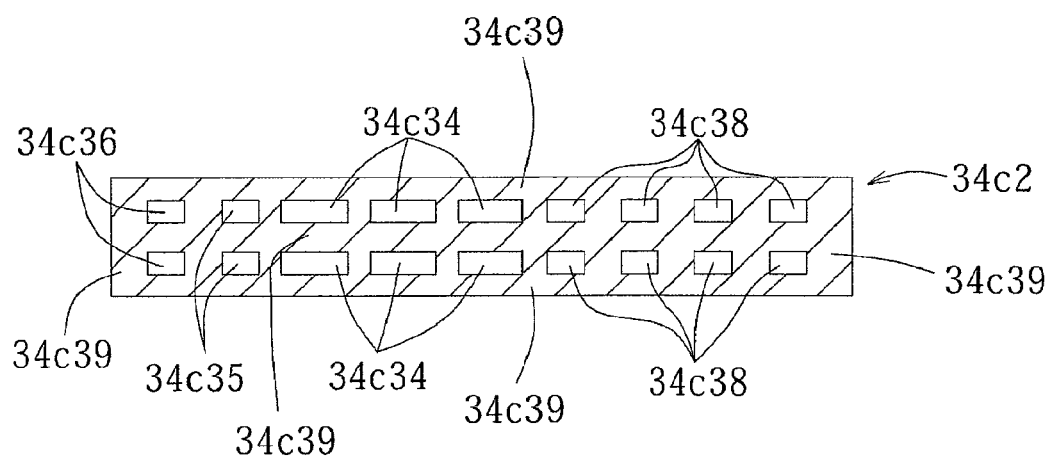
FIG. 12 is a schematic section view of the circuit board of the fourth embodiment taken along line A-A in FIG. 11.

Next, a circuit board in accordance with a fourth embodiment of the present invention will be described with reference to FIGS. 11 and 12. FIG. 11 is a schematic axial top plan view showing a circuit board 34c in accordance with the fourth embodiment of the present invention. FIG. 12 is a schematic section view of the circuit board 34c taken along line A-A in FIG. 11.

Referring to FIG. 11, the circuit board 34c is made of a material with flexibility such as a polyimide film or the like. The circuit board 34c is integrally formed with the portion corresponding to the FFC 35. The circuit board 34c includes a body portion 34c1 overlapping with the attachment plate 33 and a cable portion 34c2 corresponding to the FFC 35. The circuit board 34c is provided with wiring lines 34c3 made of a copper foil having a uniform thickness.

The wiring lines 34c3 include three output-side land portions 34c31 electrically connected to the end portion 322ue of the U-phase coil 322u, the end portion 322ve of the V-phase coil 322v and the end portion 322we of the W-phase coil 322w, a connection-side land portion 34c32 electrically connected to the neutral point 322c, a connection portion 34c33 provided in the end portion of the cable portion 34c2, three output-side wiring portions 34c34 arranged to electrically interconnect the output-side land portions 34c31 and the connection portion 34c33, a connection-side wiring portion 34c35 arranged to electrically interconnect the connection-side land portion 34c32 and the connection portion 34c33, a conduction wiring portion 34c36 electrically connected to the screw 36 (see FIG. 2) and arranged to form a ground potential, a sensor-side land portion 34c37 electrically connected to the sensor unit 342 (see FIG. 2), and a sensor-side wiring portion 34c38 arranged to electrically interconnect the sensor-side land portion 34c37 and the connection portion 34c33.

Referring to FIG. 12, the output-side wiring portions 34c34 and the connection-side wiring portion 34c35 are respectively laminated in two layers. In other words, an insulator 34c39 is arranged between two copper foils forming the output-side wiring portions 34c34 and the connection-side wiring portion 34c35. The insulator 34c39 is formed to cover the outer surfaces of the output-side wiring portions 34c34 and the connection-side wiring portion 34c35.

Use of the output-side wiring portions 34c34 laminated one above the other in two layers makes it possible to increase the electric current supplied to the coils 322 without having to increase the plan-view area of the circuit board 34c. Accordingly, it is possible to intensify the magnetic fields generated in the coils 322 and to increase the rotation speed of the motor.

The width W1c of each of the output-side wiring portions 34c34 (see FIG. 11) is greater than the width W2c of the connection-side wiring portion 34c35 (see FIG. 11). This makes it possible to reduce the electric resistance of the output-side wiring portions 34c34, thereby increasing the electric current supplied to the coils 322.

The width W3c of the sensor-side wiring portion 34c38 (see FIG. 11) is smaller than the width W1c of each of the output-side wiring portions 34c34 (see FIG. 11). This makes it possible to reduce the area of the circuit board 34c occupied by the sensor-side wiring portion 34c38, which in turn makes it possible to increase the width W1c of the output-side wiring portions 34c34. Accordingly, it is possible to intensify the magnetic fields generated in the coils 322 and to increase the rotation speed of the motor. In particular, since the body portion 34c1 and the cable portion 34c2 is seamlessly formed into one piece in the circuit board 34c, it is possible to eliminate the portion corresponding to the connection portion 3413, 3413a or 3413b which would be required in the circuit board 34, 34a or 34b. As compared to the circuit board 34, 34a or 34b, therefore, it is possible to increase the ratio of the output-side wiring portions 34c34 to the width W9 between the opposite peripheral edges of the body portion 34c1. In other words, it is possible to further increase the width W1c of each of the output-side wiring portions 34c34, thereby increasing the electric current supplied to the coils 322.

While the motor 10 of the aforementioned embodiments, particularly the structure of the circuit board 34, 34a, 34b and 34c, have been described hereinabove, the present invention is not limited thereto. Various modifications and changes may be made without departing from the scope of the invention.

For example, although the first bearing portion 41 of the bearing mechanism 40 of the present motor 10 is made of an oil-impregnated sintered material and the second bearing portion 42 is made of a resin material, the present invention is not limited thereto. Alternatively, the bearing mechanism 40 may be other bearing mechanisms such as a ball bearing and the like.

As another example, although the chucking unit 24 of the present motor 10 is designed to hold the disk D in place in cooperation with the clamp member 54, the present invention is not limited thereto. Alternatively, it may be possible to use a so-called self-chucking device having chucking claws arranged to hold a disk in place.

Further, for example, although the FCC 35 is used to interconnect the circuit board 34 of the present motor 10 and another circuit board or an external power source, the present invention is not limited thereto. Alternatively, as the flexible circuit member, a flexible circuit board may be used in place of the FFC 35.

In addition, for example, although the output-side wiring portions 3414 of the circuit board 34, 34a or 34b are formed of a single layer of copper foil, the present invention is not limited thereto. Alternatively, each of the output-side wiring portions 3414 may be formed by laminating two layers of copper foils in a spaced-apart relationship as is the case in the output-side wiring portions 34c34 of the circuit board 34c.

Moreover, for example, although the output-side wiring portions 3414 and the sensor-side wiring portion 3417 are connected to the terminal portions 3418 or 3418a at the same side in the circuit board 34 or 34a, the present invention is not limited thereto. Alternatively, just like the relationship between the output-side wiring portions 3414 and the second wiring portion 3432 of the circuit board 34b, the output-side wiring portions 3414 and the sensor-side wiring portion 3417 may be connected to the terminal portions 3418 or 3418a at the opposite sides.

Furthermore, for example, although the connection portion 3413, 3413a or 3413b is formed of a copper foil alone, the present invention is not limited thereto. Alternatively, a connector may be electrically connected to the connection portion 3413, 3413a or 3413b.

Besides, for example, although each of the output-side wiring portions 3414 is connected to the two adjoining terminal portions 3418a in the circuit board 34a, the present invention is not limited thereto. Alternatively, each of the output-side wiring portions 3414 may be connected to three or more of the adjoining terminal portions 3418a. The terminal portions 3418a to which each of the output-side wiring portions 3414 is connected need not adjoin to each other but may be remote from each other.

Further, for example, although the connection portion 3413, 3413a or 3413b is formed of a land portion, the present invention is not limited thereto. Alternatively, a connector may be mounted to the connection portion 3413, 3413a or 3413b. In this case, the first terminal portion 352 of the FFC 35 may be structurally the same as the second terminal portion 353.

Hereinafter, there will be described the results of measuring the rotation number of the motor depending on the cross-sectional area of the conductor by varying the width of the output-side wiring portion in the circuit board. The rotation number of the motor 10 described above was measured by setting the width of the output-side wiring portion in the circuit board 34 to 0.5 mm and 1.0 mm. At this time, the power voltage was set to 11.5 V. The results were indicated in the following Table 1.

TABLE 1

|  | Width of wiring portion (mm) | Thickness of wiring portion (μm) | Cross-sectional area of conductor (×10⁻³ mm²) | Rotation number of motor (rpm) |
| --- | --- | --- | --- | --- |
| Conventional Example | 0.5 | 35 | 17.5 | 12,654 |
| Inventive Example | 1.0 | 35 | 35.0 | 12,703 |

As can be seen from Table 1, by differentiating the width of the output-side wiring portion, the rotation number of the motor was increased about by 50 rpm in the inventive example compared with the conventional example.

The cross-sectional area of the conductor in the output-side wiring portion was $17.5 \times 10^{-3}$ mm² in the conventional example and $35 \times 10^{-3}$ mm² in the inventive example.

From the above results, it is noted that, by setting the cross sectional area of the conductor in the output-side wiring portion to $35 \times 10^{-3}$ mm² or more, the rotation number of the motor can be increased compared with the conventional example.

While the invention has been shown and described with respect to the preferred embodiments, it will be understood by those skilled in the art that various changes and modification may be made without departing from the scope of the invention as defined in the following claims.

What is claimed is:

1. A motor for holding a disk with a mounting opening in place, comprising:
    a rotor unit including a rotor magnet rotatable about a central axis; and
    a stator unit including a stator arranged opposite to the rotor magnet and a circuit board electrically connected to the stator,
    wherein the stator includes a plurality of coils made of a conductive wire and arranged to generate magnetic fields, said plurality of coils creating a neutral point and end portions,
    wherein the circuit board is provided with wiring lines electrically connected to the coils,
    wherein the wiring lines comprise:
        output-side land portions, each electrically connected to one of the end portions;
        a connection-side land portion electrically connected to the neutral point;
        first connection portions and a second connection portion, each electrically connected to an external power source or an external circuit board;
        output-side wiring portions, each arranged to electrically interconnect each of the output-side land portions and each of the first connection portions, and
        a connection-side wiring portion arranged to electrically interconnect the connection-side land portion and the second connection portion, and
    wherein each of the output-side wiring portions has a width greater than a width of the connection-side wiring portion,
    wherein the connection-side wiring portion is extended from the second connection portion at a direction opposite to the direction at which the output-side wiring portions are extended from the first connection portions.

2. The motor of claim 1, wherein each of the output-side wiring portions is greater in width than each of the first connection portions and the second connection portion.

3. The motor of claim 1, wherein each of the output-side wiring portions has a cross-sectional conductor area of at least $35 \times 10^{-3}$ mm$^2$.

4. The motor of claim 2, wherein each of the output-side wiring portions is connected to each of the first connection portions, wherein the first connection portions are adjoining to each other.

5. The motor of claim 4, wherein each of the first connection portions includes a junction portion.

6. The motor of claim 1, wherein
    a sensor unit arranged to read information recorded on a motor-side surface of the disk is mounted to the circuit board,
    the wiring lines of the circuit board further comprise a sensor-side land portion electrically connected to the sensor unit and a sensor-side wiring portion arranged to interconnect the sensor-side land portion and a third connection portion, and
    the sensor-side wiring portion is smaller in width than each of the output-side wiring portions.

7. The motor of claim 1, wherein
    a connector arranged to supply an electric current to coils of a stator of another motor is mounted to the circuit board,
    the wiring lines further comprise a second land portion electrically connected to the connector and a second wiring portion arranged to interconnect the second land portion and a fourth connection portion, and
    the second wiring portion is smaller in width than each of the output-side wiring portions.

8. The motor of claim 1, wherein each of the output-side wiring portions has an increased width portion whose width increases toward each of the output-side land portions.

9. The motor of claim 1, wherein
    a flexible circuit member is connected to the first connection portions and the second connection portion,
    the flexible circuit member includes a first terminal portion connected to the first connection portions and the second connection portion, a second terminal portion arranged opposite to the first terminal portion and a connection wiring portion arranged to electrically interconnect the first terminal portion and the second terminal portion, and
    the connection wiring portion is laminated in plural layers and is connected to the first terminal portion and the second terminal portion.

10. The motor of claim 9, wherein
    a connector connected to the flexible circuit member for electrical connection therewith is mounted to the first connection portions and the second connection portion of the circuit board, and
    the first terminal portion is formed of end portions of the connection wiring portion laminated in plural layers and a reinforcing plate arranged between the end portions of the connection wiring portion.

11. A disk drive apparatus provided with the motor of claim 1, comprising:
    an optical pickup mechanism arranged to emit and receive light to and from the disk; and
    a moving mechanism arranged to radially move the optical pickup mechanism.

12. A disk drive apparatus provided with the motor of claim 1, wherein the width of the connection-side land portion is greater than a width of the connection-side wiring portion.

13. A disk drive apparatus provided with the motor of claim 1, wherein a width of the second connection portion is greater than a width of the connection-side wiring portion.

14. A disk drive apparatus provided with the motor of claim 2, wherein the width of the connection-side land portion is greater than a width of the connection-side wiring portion.

15. A disk drive apparatus provided with the motor of claim 2, wherein the connection-side wiring portion has a part narrower than the width of the connection-side land portion.

16. The motor of claim 1, wherein the connection-side wiring portion is extended from a lower part of the second connection portion at a direction opposite to the direction at which the output-side wiring portions are extended from an upper part of the first connection portions.

17. A motor for holding a disk with a mounting opening in place, comprising:
    a rotor unit including a rotor magnet rotatable about a central axis; and
    a stator unit including a stator arranged opposite to the rotor magnet and a circuit board electrically connected to the stator, wherein
    the stator includes a plurality of coils made of a conductive wire and arranged to generate magnetic fields, said plurality of coils creating a neutral point and end portions,
    the circuit board is provided with wiring lines electrically connected to the coils,
    the wiring lines include:

a first coil wiring line consisting of:
- an output-side land portion made of an increased width portion at an end of the first coil wiring line for being electrically connected to one of the end portions;
- a first connection portion made of a uniformed width portion at the other end of the first coil wiring line for being electrically connected to an external power source or an external circuit board; and
- an output-side wiring portion arranged to electrically interconnect the output-side land portion and the first connection portion;

a second coil wiring line consisting of:
- a connection-side land portion made of an increased width portion at an end of the second coil wiring line for being electrically connected to the neutral point;
- a second connection portion made of a uniformed width portion at the other end of the second coil wiring line for being electrically connected to the external power source or the external circuit board, and
- a connection-side wiring portion arranged to electrically interconnect the connection-side land portion and the second connection portion, and the output-side wiring portion has a width greater than a width of the connection-side wiring portion.

18. A disk drive apparatus provided with the motor of claim 17, wherein a width of the second connection portion is greater than a width of the connection-side wiring portion, wherein a width of the first connection portion is smaller than a width of the output-side wiring portion, wherein the width of the second connection portion is substantially the same as the width of the first connection portion.

* * * * *